United States Patent
Beck (10) Patent No.: US 10,132,904 B2
(45) Date of Patent: Nov. 20, 2018

(54) GENERATION OF MR IMAGES WITH PROSPECTIVE MOTION CORRECTION AND PARTIAL-VOLUME-SPECIFIC WEIGHTING OF IMAGE INFORMATION

(71) Applicant: Thomas Beck, Erlangen (DE)

(72) Inventor: Thomas Beck, Erlangen (DE)

(73) Assignees: Siemens Aktiengesellschaft, München (DE); Siemens Healthcare GmbH, Erlangen (DE)

( * ) Notice: Subject to any disclaimer, the term of this patent is extended or adjusted under 35 U.S.C. 154(b) by 65 days.

(21) Appl. No.: 15/459,925

(22) Filed: Mar. 15, 2017

(65) Prior Publication Data
US 2017/0269182 A1 Sep. 21, 2017

(30) Foreign Application Priority Data
Mar. 15, 2016 (DE) .................. 10 2016 204 198

(51) Int. Cl.
*G01V 3/00* (2006.01)
*G01R 33/567* (2006.01)
*G01R 33/483* (2006.01)
*G01R 33/565* (2006.01)

(52) U.S. Cl.
CPC ..... *G01R 33/5676* (2013.01); *G01R 33/4835* (2013.01); *G01R 33/56509* (2013.01); *G01R 33/56536* (2013.01)

(58) Field of Classification Search
CPC .............................................. G01R 33/56536
USPC ......................................... 324/306, 307, 309
See application file for complete search history.

(56) References Cited

U.S. PATENT DOCUMENTS

| | | | |
|---|---|---|---|
| 9,103,897 B2 * | 8/2015 | Herbst | G01R 33/5673 |
| 9,606,209 B2 * | 3/2017 | Ernst | G01R 33/56509 |
| 2002/0033698 A1 | 3/2002 | Heid | |
| 2013/0278263 A1 | 10/2013 | Huang et al. | |
| 2015/0084629 A1 | 3/2015 | Porter | |
| 2015/0346307 A1 | 12/2015 | Beck | |
| 2017/0307712 A1 * | 10/2017 | Cai | G01R 33/561 |

FOREIGN PATENT DOCUMENTS

| | | |
|---|---|---|
| DE | 10044424 A1 | 4/2002 |
| DE | 102013219120 B3 | 3/2015 |
| DE | 102015207591 A1 | 10/2016 |

OTHER PUBLICATIONS

German Office Action for German Application No. 102016204198.3, dated Oct. 26, 2017.
Manke, Dirk, et al. "Novel prospective respiratory motion correction approach for free-breathing coronary MR angiography using a patient-adapted affine motion model." Magnetic Resonance in Medicine 50.1 (2003): 122-131.

(Continued)

*Primary Examiner* — Louis Arana
(74) *Attorney, Agent, or Firm* — Lempia Summerfield Katz LLC (57) ABSTRACT

A method for creating a magnetic resonance (MR) image with prospective motion correction with a recording of navigation signals and navigator reference signals for the determination of motion information is provided. During the determination of the motion information, the partial volumes of the navigator volume are not all treated equally. Different weightings are used.

16 Claims, 4 Drawing Sheets

(56) References Cited

OTHER PUBLICATIONS

German Office Action for German Application No. 102016204198.3, dated Oct. 26, 2017, with English Translation.
German Grant Decision for German Application No. 102016204198.3, Grant decision Feb. 27, 2018, with English Translation.
Bhat, Himanshu, et al. "Epi navigator based prospective motion correction technique for diffusion neuroimaging." Proceedings of the 19th Annual Meeting of ISMRM; May; Melbourne, Australia. 2012.
Maclaren, Julian, et al. "Prospective motion correction in brain imaging: a review." Magnetic resonance in medicine 69.3 (2013): 621-636.
Shankaranarayanan, A., et al. "Motion insensitive 3D imaging using a novel real-time image-based 3D PROspective MOtion correction method (3D PROMO)." Proc. Intl. Soc. Mag. Reson. Med. vol. 15. 2007.
Thesen Bon. "Combined Faculty of Mathematics andNatural Sciences." Heidelberger Dokumentenserver. Nov. 14, 2001.
Thesen, Stefan, et al. "Prospective acquisition correction for head motion with image-based tracking for real-time fMRI." Magnetic Resonance in Medicine 44.3 (2000): 457-465.
Tisdall, M. D., A. T. Hess, and A. J. W. Van der Kouwe. "MPRAGE using EPI navigators for prospective motion correction." Proceedings of the 17th annual meeting of International Society of Magnetic Resonance in Medicine. 2009.

\* cited by examiner

FIG 5

GENERATION OF MR IMAGES WITH PROSPECTIVE MOTION CORRECTION AND PARTIAL-VOLUME-SPECIFIC WEIGHTING OF IMAGE INFORMATION

This application claims the benefit of DE 10 2016 204 198.3, filed on Mar. 15, 2016, which is hereby incorporated by reference in its entirety.

TECHNICAL FIELD

The present embodiments relate to conducting a magnetic resonance (MR) examination of an examination object with prospective motion correction.

BACKGROUND

For prospective motion correction, the motion of the examination object, such as, for example, a head movement of a patient, is detected during the acquisition of a volume and corrected in real time. Such prospective motion corrections are, for example, necessary during functional magnetic resonance (MR) examinations or during MR examinations for the compilation of parameter maps such as T1 maps in order to correct motions of the examination object that occur during the scan.

There are numerous possible ways for achieving this. One possibility is the use of image-based navigators. The use of navigators is, for example, suitable for long pulse sequences in which waiting times occur in which the additional navigator signal may be scanned. For example, low-resolution 3D EPI navigators may be used that may be recorded in approximately 500 ms. Each imaging sequence with dead times of longer than 500 ms may be provided with these navigators in order to perform real-time motion compensation. To achieve this, the EPI navigators are reconstructed and registered by image-based methods to a reference time, the navigator reference signal, for the determination of motion information. The calculated detected motion parameters of the current navigator are sent to the sequence to enable this to take account of the motion and, for example, adapt the position of the region of interest.

Very high requirements are placed on the detection of the motion parameters in order to be able to implement real-time motion correction. For this reason, rigid model assumptions with six degrees of freedom, three translation degrees of freedom, and three rotation degrees of freedom, which are justified in numerous applications, such as, for example, in the head, are made. Hence, for the motion detection, the navigator signals are compared to a navigator reference signal, or the navigator data set is registered to the navigator reference data set. Examples of techniques for motion detection are, for example, known from THESEN S. et al, "Prospective Acquisition Correction for Head Motion With Image-Based Tracking for Real-Time fMRI" in Magn. Reson. Med. 44 (2000) 457-465; such techniques may also be used in conjunction with the techniques described herein.

The same principle may be used without the use of an additional navigator signal by taking account of the MR signals for the generation of the MR image. This procedure may be used in the case of time-resolved volume data. In this case, an image data set of a subsequent time point is registered to a reference time point. The detected motion parameters of a time point t1 relative to a reference time t0 are compensated in the next time point t2. As a result, the motion compensation is delayed by at least one repetition time compared to the actual motion. This delay may sometimes be tolerated in the case of continuous, small motions, caused, for example, by breathing, but not in all fields of application.

During the recording of image-based navigators and the associated MR data, it may happen that, in the navigator volume, in which the navigator signals and navigator reference signals are recorded, regions occur that contain little to no image information so that registration to the navigator reference data set is difficult.

There may be numerous causes of such signal failures in the navigator volume. First, this may entail regions with large susceptibility jumps in the tissue in which the navigator signal contains anatomy-induced low MR signals. It may also be the case that the MR imaging sequence that is actually to be prospectively motion-corrected is recorded in a plurality of segments. These segments are separated by the navigator recording. In this case, residual magnetization may occur in the navigator volume as a result of the previous recording of a segment of the imaging sequence. This residual magnetization may greatly influence the image quality in the navigator volume during the recording of the navigator signals. This provides that the residual magnetization greatly influences the image quality of the navigator. If the signal voids in the navigator image data are too strong, robust detection of motion is no longer possible.

SUMMARY AND DESCRIPTION

The scope of the present invention is defined solely by the appended claims and is not affected to any degree by the statements within this summary.

The present embodiments may obviate one or more of the drawbacks or limitations in the related art. For example, prospective motion correction in cases in which not all regions in the navigator volume provide sufficient contrast is enabled.

According to a first aspect, a method is provided for conducting a magnetic resonance (MR) examination of an examination object for the compilation of at least one MR image of the examination object with prospective motion correction. With the method, a region of interest in which the at least one MR image is to be generated from the examination object is defined. The navigator volume for recording navigator signals is also defined, and a navigator reference signal of the navigator volume is recorded during a first time interval. Also recorded is a navigator signal of the navigator volume during a second time interval following the first time interval. Motion information for the examination object is determined from the comparison of the navigator reference signal with the navigator signal by which the motion between the first time interval and the second time interval may be determined. The region of interest for the generation of the at least one MR image is adapted taking account of the motion information. The navigator volume is subdivided into a plurality of partial volumes, where the navigator signals from the partial volumes are weighted differently during the comparison with the navigator reference signal for the generation of the motion information so that not all partial volumes of the navigator volume contribute equally to the determination of the motion information.

The different weighting of the partial volumes during the comparison with the navigator reference signal enables account to be taken of regions in the navigator volume in which, due to low contrast, no registration to the navigator reference signal is possible. Each partial volume is categorized by the associated weighting as to whether the information content in the associated partial volume is high or low or whether or not it is possible to have confidence in the motion information contained in a partial volume. If there is less confidence in a partial volume and the associated navigator signal from the partial volume because, for example, this partial volume only contains very low signal contrasts, this partial volume may be weighted very low during the comparison with the navigator reference signal in comparison with other partial volumes in which there is a better signal-to-noise ratio or in which the anatomical structures may be identified more efficiently and hence registration to the navigator reference signal is possible.

In this case, at least one partial volume of the navigator volume may be weighted during the comparison such that the at least one partial volume is not taken into account at all in the determination of the motion information. This provides that the associated partial volume is given a weighting of zero and is not taken into account during the registration of the image data from the navigator volume to the image data of the associated navigator reference signal. If the partial volume with a weighting of zero may be determined before the recording of the navigation signals, this partial volume may be excluded during the measurement of the navigation signals so that the measuring time for the navigator data set may be reduced.

The navigator volume may be recorded in a plurality of different slices with different weightings in the determination of the motion information. If it is known for one slice in the navigator volume that the slice has strong residual magnetization due to the previous recording of MR signals for the imaging sequence for the compilation of the MR image, the corresponding slices may be taken into account with very low weighting or even zero weighting in the determination of the motion information.

As mentioned above, before the recording of the navigator signal, at least one part of the navigator volume may be excited for recording the MR signals for the actual MR image, thus resulting in residual magnetization in the navigator volume. It is then possible to determine the influence of residual magnetization on the different partial volumes or slices. The weighting of the partial volumes during the comparison with the navigator reference signal is performed in dependence on the residual magnetization in the associated partial volume. From the imaging sequence used, it is possible to calculate the partial volume of the navigator volume in which intensified signal voids are to be expected during the recording of the navigator signal. These regions may then be determined and are not taken into account in the determination of the motion information based on the comparison, or the associated navigator signals may be not recorded at all.

In one embodiment, the motion information may take account of predetermined types of motion. At least one first partial volume is determined in the navigator volume with which a motion outside the predetermined types of motion is possible and is expected. This first partial volume is weighted lower than the other partial volumes in the navigator volume in the determination of the motion information. This enables anatomical structures that are known not to behave in the sense of an assumed motion model to be left out during the detection of the motion parameters. During the recording of the head, this may, for example, entail the eyes, the jaw, or the neck muscles. These partial volumes in the navigator volume may then be weighted lower during the comparison with the associated navigator reference signals.

It would, for example, be possible for the predetermined types of motion to include motions that may be described in accordance with the modeled degrees of freedom. An example of this would be, for example, rigid types of motion, which may be described by 3 translation and 3 rotation degrees of freedom.

In one embodiment, the weightings may vary as a function of time. This provides that the weighting of the partial volumes change over the duration of the imaging sequence for the compilation of the MR image. The at least one MR image may be recorded in a plurality of part-segments, where in each case, a navigator signal is recorded between two part-segments. In this case, the weighting of a partial volume during a first recording of the navigator signals may differ from the weighting of the partial volumes during the later second recording of the navigator signals.

One or more of the present embodiments also relate to the associated magnetic resonance system, which, as described above, is embodied to weight the partial volumes differently during the motion correction. The magnetic resonance system may include a control mechanism embodied to carry out the above-described method acts.

Also provided is a computer program product that includes a program that may be directly loaded into a memory of a memory of the control mechanism of the MR system. Acts of the method may be carried out as described above when the program is executed in the control unit (e.g., a controller) of magnetic resonance system. Also provided is an electronically readable data medium (e.g., a non-transitory computer-readable storage medium) with electronically readable control information stored thereon. When the data medium is used in a control unit of the MR system, the above-described method is carried out.

The determination of the motion information may entail the use of an iterative optimization method in which an interpolation method is used in order to obtain identical coordinates with a navigator reference data set generated from the navigator reference signal and a navigator data set generated from the navigator signal. The interpolation method will then take account of the different weightings of the partial volumes of the navigator signals.

If a partial volume in the navigator data set is not taken into account at all (e.g., the associated weighting by the weighting factor is zero), it may be the case that the interpolation method is used in order to generate the non scanned region of the navigator data set from adjacent regions of the navigator data set by interpolation (e.g., linear interpolation). Such linear interpolation of the non-scanned region of the navigator data set by scanned regions of the navigator data set then enables account to be taken of the weightings of the respective regions used during the interpolation.

DETAILED DESCRIPTION

Figure 1:
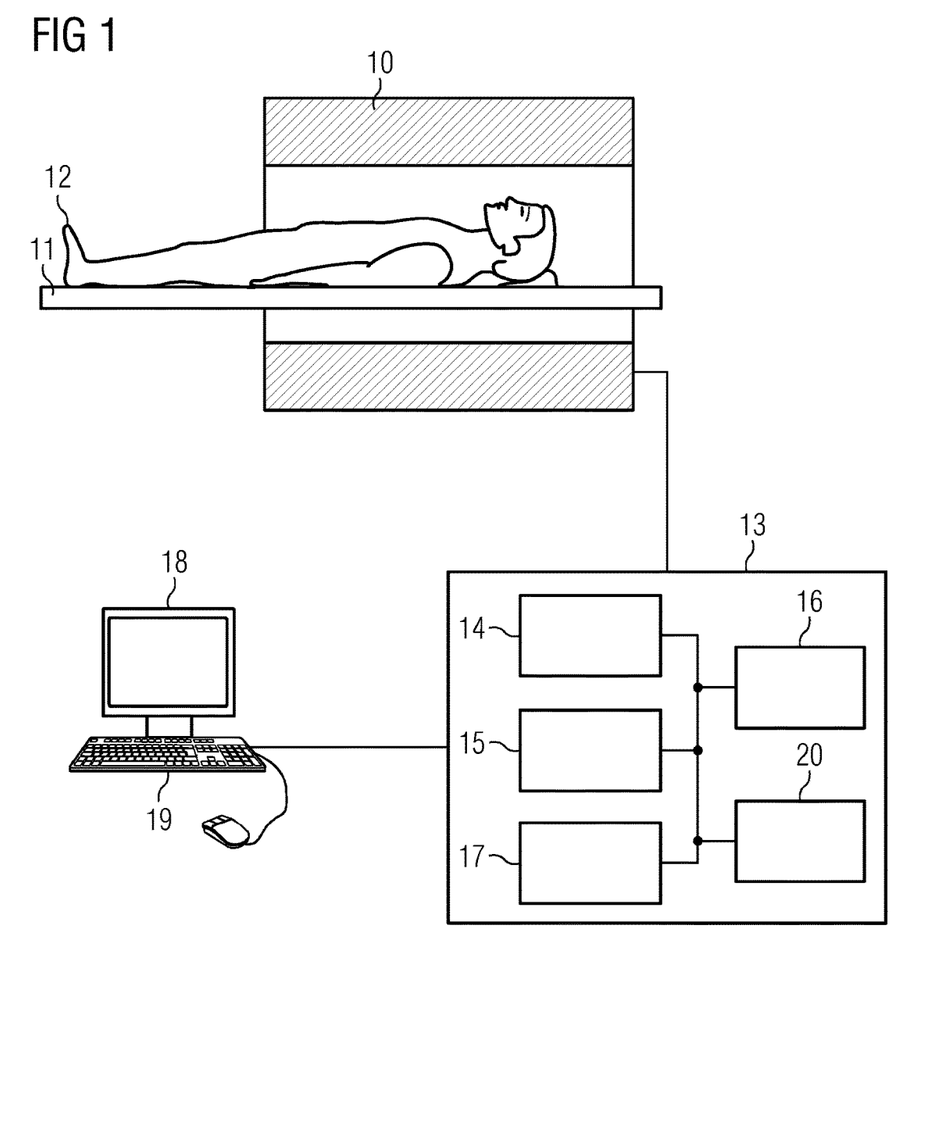
FIG. 1 shows schematically a magnetic resonance system with which prospective motion correction may be carried out according to an embodiment.

FIG. 1 is a schematic view of a magnetic resonance (MR) system with which prospective motion correction according to one or more embodiments may be provided even if not all regions in the associated navigator volume have sufficient signal quality for generating motion information for all sub-regions of the navigator volume. The magnetic resonance system includes a magnet 10 for the generation of a polarization field B0, where an examination subject 12 arranged on a bed 11 is moved into the center of the magnet in order to record spatially encoded magnetic resonance signals from a region of interest. The irradiation of radio-frequency pulse sequences and switching of magnetic field gradients may disrupt the magnetization generated by the basic field B0 by the deflection of the nuclear spins out of the equilibrium position, and the currents induced on the return to the equilibrium position in the receiver coils that are not shown may be converted into magnetic resonance signals. The general mode of operation for the creation of MR images and the detection of the magnetic resonance signals are known to the person skilled in the art. Accordingly, no detailed explanation of this will be given.

The magnetic resonance system also includes an MR control unit 13 that is used to control the magnetic resonance system. The central MR control unit 13 includes a gradient control system 14 for controlling and switching the magnetic field gradients and a RF control unit 15 for controlling and irradiating the RF pulses for deflecting the nuclear spins out of the equilibrium position. A memory unit 16 may, for example, be used to store the imaging sequences for recording the MR images and all program modules used to operate the MR system. A recording unit 17 controls the image recording and also controls the sequence of magnetic field gradients and the RF pulses and the receive intervals of the MR signals in dependence on the selected imaging sequence. Thus, recording unit 17 controls the gradient control system 14 and the RF control unit 15. A computing unit 20 may calculate MR images that may be displayed on a screen 18, where an operator is able to control the MR system via an input unit 19. As will be explained below, the computing unit may calculate correction motion information for prospective motion, where the recording unit 17 may apply the correction motion information to the subsequent imaging. For example, in this case, individual partial volumes in a navigator volume may be weighted differently and hence contribute differently to the determination of motion information.

Figure 2:
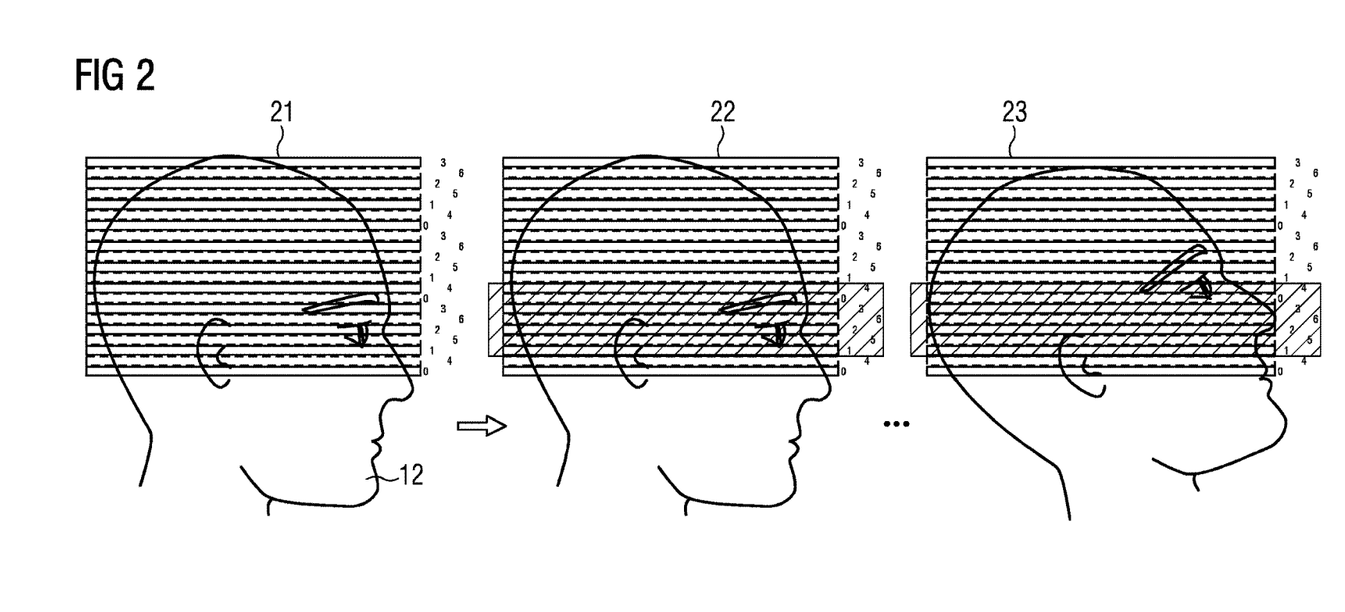
FIG. 2 shows schematically exemplary recording of a plurality of navigator data sets and of a navigator reference data set for the determination of the motion information.

FIG. 2 is a schematic representation of an example of how navigator reference signals and navigator signals may be used for the determination of motion information. MR images of the head of the examination subject 12 are to be taken, for example, for the performance of functional MR imaging with which the changes in the oxygen content in different brain areas are to be detected in dependence on different brain activities. In this case, the temporal change of the same brain regions are to be compared with one another. A navigator reference signal is recorded from the examination subject 12 for the generation of a navigator reference data set 21. At a later time point during the imaging, further navigator signals are recorded for the generation of a navigator data set 22 and, at a later time point, a further navigator data set 23. The acquisition of the navigator reference data set 21 typically takes place at the start or relatively early during the course of an MR scan. This navigator reference volume is, for example, acquired before the start of the imaging sequence to be corrected so that there is no residual magnetization of the sequence to be corrected. Hence, the navigator reference signal is assumed to be free of artifacts in all slices.

Figure 3:
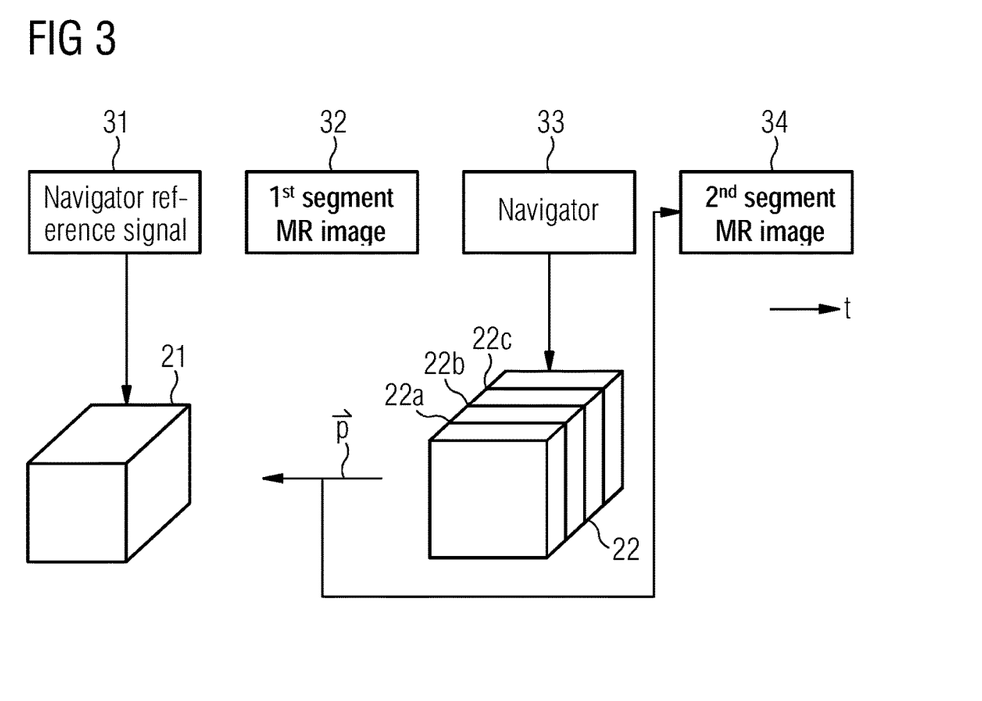
FIG. 3 shows schematically an exemplary sequence diagram showing how motion information may be generated from a comparison of the navigator signal with the navigator reference signal, where the motion information may be applied to the subsequent imaging.

FIG. 3 shows an exemplary temporal course of the recording of the navigator signals relative to the recording the MR signals for the imaging sequence. The navigator reference signal may be recorded during a time interval 31 for the generation of the navigator reference data set 21. In a subsequent time interval 32, a first segment of the MR image data to be generated is recorded. In a time interval 33, further navigator signals are recorded for the generation of the navigator data set 22. The navigator data set 22 is registered to the navigator reference data set 21 in order to generate motion information (e.g., a vector P with the transformation parameters). The vector P may, for example, be restricted to rigid transformation parameters with three translation parameters and three rotation parameters. If these parameters of the transformation vector P are known, the parameters may be used during the recording of the second segment of the MR image data in the time interval 34 (e.g., such that the position of the volume of interest is corrected such that the motion parameters P are compensated and hence the same volume of interest is recorded as during the recording of the image data set for the time interval 32). With reference to FIG. 2, it may, for example, be identified that the examination subject 12 has moved the head during the recording of the navigator data set 23 so that the same anatomical structures in the region of interest would no longer be covered during the subsequent further recording of a further segment of MR imaging. With a method such as that shown in FIG. 3, the problem may occur that the recording of the MR images, such as, for example, in the time intervals 32 and 34, results in strong residual magnetization. Since the navigator volume is contained in the volume recorded during the actual MR imaging, during the recording of the navigator signals (e.g., during the time interval 33), this residual magnetization may result in voids. With reference to FIG. 3, this provides that usable contrasts are not available in the entire volume of the navigator data set 22 in order to the register the anatomy shown there to the anatomy shown in the navigator reference data set 21. Motions that may not be described by the assumed rigid transformation parameters such as translation and rotation may occur in the navigator volume of the navigator data set 22.

Similarly to the navigator reference data set, the navigator data set is recorded in a plurality of partial volumes: in the example shown in FIG. 3, in a plurality of slices, the slices 22a to 22c. The navigator data set 22 may include more than the slices shown. The individual partial volumes of the navigator volume or the navigator data set 22 may be weighted slice-specifically or in a time-variable manner. Weighting of this kind enables prospective motion correction for a plurality of clinical scans, which in the prior art, could not be motion-corrected by image-based method. It is hence possible to weight the individual partial volumes or slices of the navigator data set to a greater or lesser extent. Since the regions containing residual magnetization may change dynamically, it is possible to perform a dynamic adaptation of the weighting of the individual partial volumes. The weightings in the form of weighting factors may also be considered to be confidence or information content in each partial volume.

The navigator volume may, for example, be a partial volume of the region of interest.

In this case, specific partial volumes or slices of the navigator volume may not to be taken into account at all in the determination of the motion information. If this is known in advance, the associated slices in the navigator data may not even be scanned so that overall the recording time for scanning the navigator signals (e.g., the time interval 33) is reduced. This is shown schematically in FIG. 4.

Figure 4:
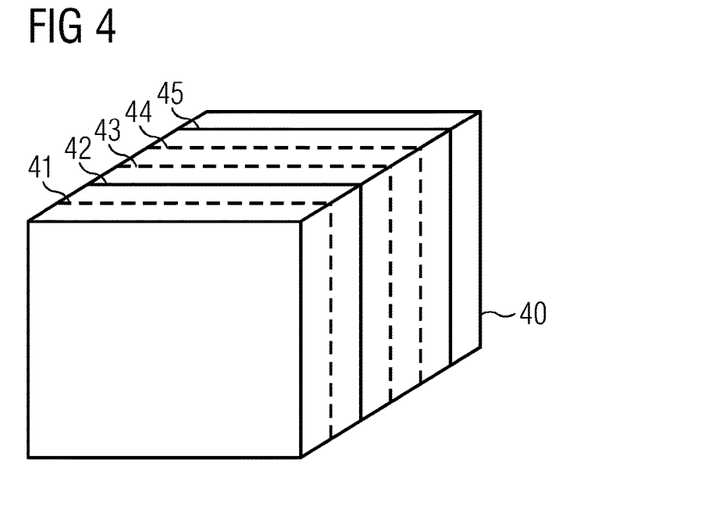
FIG. 4 shows schematically an exemplary navigator data set from the navigator signals with which some slices are not taken account of as partial volumes and are therefore not scanned.

FIG. 4 is a schematic view of an exemplary navigator data set 40 scanned in a plurality of individual slices. The scanned slices shown in FIG. 4 with continuous lines such as the slices 42 and 45 were scanned, while no navigator data was recorded for the slices 41, 43 and 44, for example, because it was possible to calculate or known in advance either that these slices have high residual magnetization or that the anatomical structure contains little tissue or that motions occur there that have non-linear components that are not taken into account during the motion correction. In the head, such non-linear motion components may, for example, occur in the region of the neck, jaw, or orbital cavities.

The following procedure may be used for the calculation of the motion information:

The motion of the examination subject may be approximated by a first degree Taylor series using a gradient image of the navigator reference data set with respect to the degrees of freedom considered. This method is modified in that partial volumes, or not completely scanned navigator data sets may be depicted on a completely scanned navigator reference data set. With reference to FIG. 4, this provides that the navigator data set 40 would be depicted on the navigator reference data set 21 that was completely scanned. For this, a weighting vector g that defines a weight specifically for each slice considered is introduced. In this way, for the determination of optimal motion parameters, only slices with a positive weighting are taken into account when forming the Jakobi matrix. Using $$y \approx x + \underbrace{\begin{pmatrix} \frac{\partial x_0}{\partial p_0} & \cdots & \frac{\partial x_0}{\partial p_5} \\ \vdots & \ddots & \vdots \\ \frac{\partial x_{n-1}}{\partial p_0} & \cdots & \frac{\partial x_{n-1}}{\partial p_5} \end{pmatrix}}_{J} \cdot p \quad (1)$$

with $$\frac{\partial x_i}{\partial p_j} \approx \frac{(x(+p_j) - x(-p_j))}{2 \cdot p_j} \quad (2)$$

ideal motion parameters are determined within the meaning of the least squares method. In this case, y designates the volume to be currently transformed (e.g., the navigator volume 40), x designates the navigator reference data set, and p designates the vector of transformation parameters with, for example, three translation and three rotation components.

In equation (2), the index n designates the number of individual image points or voxels of a volume. In this case, a volume is represented as a (n×1)-dimensional column vector.

An ideal solution may be determined iteratively by the use of the pseudo-inverses of the Jakobi matrix J by $$p \approx (J^T \cdot J)^{-1} \cdot J^T \cdot (y-x) \quad (3)$$

as described below.

In equation (2), the index n designates the number of individual image points or voxels of a volume. In this case, a volume is represented as a (n×1)-dimensional column vector.

The determination of the optimal motion parameters with the translation in x-, y- and z-directions or the rotation in x-, y- and z-directions is performed using an iterative optimization method. Following an iteration of this method, the motion parameters determined at this time point are to be applied to the movable volume, the navigator data set, in order to enable a comparison with the navigator reference data set 21. The application of the motion parameters provides that the transformed image points no longer lie on an identical voxel grid, thus rendering direct comparison of the volumes impossible. To enable scanning of the transformed volume of the navigator signal at the identical coordinates in the space containing the navigator reference data set, the image data is to be interpolated at these points from the spatially adjacent points. Since not all slices were scanned in the navigator data set 40, non-scanned slices in the navigator data set 40 are to be interpolated. In this case, the slice-specific weighting factors g are to be taken into account for the slices scanned in the navigator data set 40. In this case, one possibility is the use of a linear interpolation function f (e.g., the data may be interpolated at a slice position z* taking into account the signals in the adjacent scanned slices $z_0$ and $z_1$). A slice at an intermediate position z* is then interpolated from the spatially closest actually scanned slices at the positions $z_0$ and $z_1$. For any weights in these slices, with linear interpolation, the interpolation is as follows:

$$f(z^*) = g_0(z_1 - z^*) \cdot f(z_0) + g_1(z^* - z_0) \cdot f(z_1). \quad (4)$$

If, in this case, now all scanned slices are assigned an identical weight of g=1 and all non-scanned slices are assigned a weight of 0, the function is as follows:

$$f(z^*) = g_0 \cdot f(z_0) + g_1 \cdot f(z_1) = (z_1 - z^*) \cdot f(z_0) + (z^* - z_0) \cdot f(z_1) \quad (5)$$

With the above-described method, the slice-specific weighting factor may not remain constant over time. Instead, the slice-specific weighting factor may change over time, which may be particularly advantageous. For example, varying slice weights enables moving anatomies to be tracked even though the slice position remains constant relative to an MR system over time. This may occur with respiratory movements or heart movements.

If the imaging sequence with a sequence from RF pulses and gradients is known in advance, the residual magnetization may be calculated before scanning the individual navigators. This provides the temporal course of signal voids is already known in advance so that it is possible to calculate the slice-specific weightings in advance. This provides that time-variant weighting factors enable volume regions that do not contain a sufficient image structure to be selectively suppressed in the navigator data.

The weighting vector may be expanded to include locally variable weights. This provides that not only slices may be selectively taken account of or suppressed, but also local anatomies may be specifically taken into account. This provides that not an entire slice is taken into account or is not given a weighting factor or given a single weighting factor, but the partial volume may also lie within a slice. The associated voxels are given a low weighting or no weighting. In this case, suppression of non-rigid movable anatomical structures such as the eyeballs or pulsating vessels or fluid pulsations may be provided.

Figure 5:
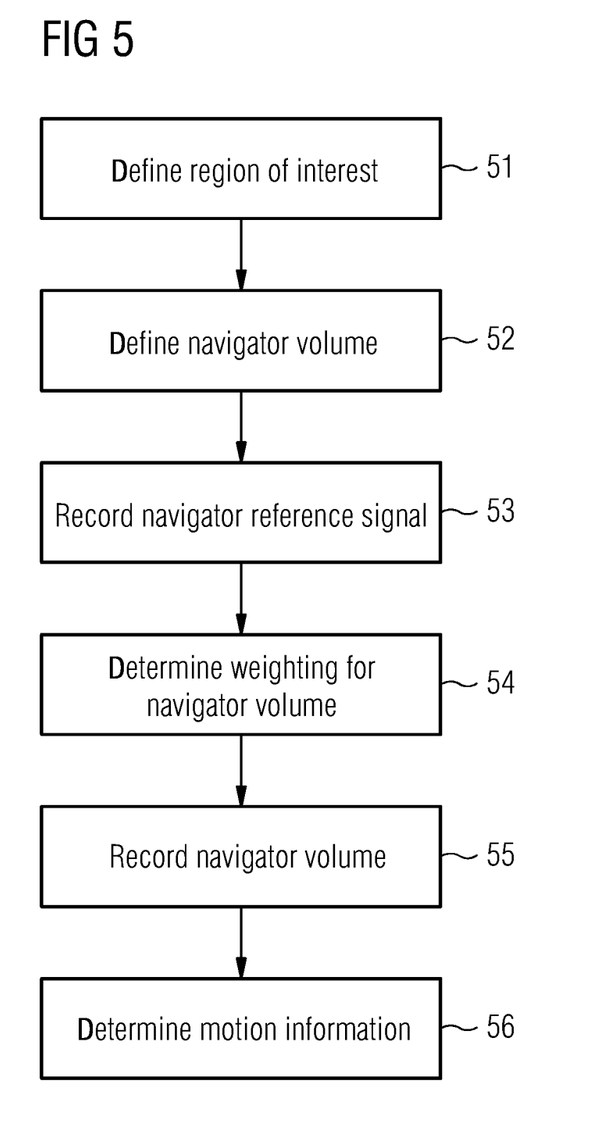
FIG. 5 shows schematically a flow diagram with the acts that may be carried out with the MR system in FIG. 1 for the determination of the motion information according to an embodiment.

FIG. 5 summarizes the acts of the method. In act 51, the region of interest, from which MR images are to be recorded, is defined. In act 52, the navigator volume is defined. The navigator volume and the volume of interest do not have to be identical. However, the navigator volume may lie in the region of interest or volume of interest since motion information is to be obtained from the navigator data that is then used during the recording of the MR images in the region of interest. In act 53, the navigator reference signals are recorded: with reference to FIG. 3, the navigator reference data set 21. In act 54, the weighting of the individual partial volumes may be determined for the recording of the navigator signals. In the case of the above-mentioned example of residual magnetization, the regions in the navigator volume with which only small structures will be identifiable due to signal voids may be determined so that registration to the navigator data set is not meaningfully possible. In act 54, the navigator volume or the navigator data sets such as the navigator data set 22 in FIG. 3 or 40 in FIG. 4 are recorded. In this case, partial volumes determined with a weighting factor of zero are not scanned at all, or partial volumes are given a lower weighting factor than other volumes if it is known that anatomical structures may only be identified with difficulty in this partial volume. Then, in act 56, the motion information is determined. Not all partial volumes of the navigator volume are taken into account equally when taking into account the weighting, as described above. In the exemplary embodiment shown in FIG. 5, it is known in advance which partial volumes are less suitable for determining motion information. The navigator volume may, however, be recorded completely, and it may be subsequently determined which partial volumes or slices are not suitable for calculating the motion information. In this case, following the recording of the navigator signals, it is, for example, possible for the signal intensities and signal-to-noise ratio to be checked automatically and sub-regions of the navigator volume to be weighted with low signal intensities or a worse signal-to-noise ratio. These sub-regions of the navigator volume are thus only restrictedly taken into account or not taken into account at all for the determination of motion information.

The effect of residual magnetization occurs, for example, when a rapid spin echo sequence, such as a turbo spin echo sequence, is used during the actual imaging sequence. The navigator volume may, for example, be calculated with an EPI sequence with a flip angle of between 1° and 5°, where the navigator volume includes 32 slices with 32×32 voxels in one image level. The navigator volume typically remains the same between the individual navigator data sets and the navigator reference data set apart from the fact that it is possible that individual slices are not scanned.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for conducting a magnetic resonance (MR) examination of an examination object for compiling at least one MR image of the examination object with prospective motion correction, the method comprising:
   defining a region of interest in which the at least one MR image is to be generated from the examination object;
   defining a navigator volume for recording navigator signals, wherein the navigator volume is subdivided into a plurality of partial volumes;
   exciting at least one part of the navigator volume for recording MR signals for the at least one MR image, the exciting causing residual magnetization to form in the navigator volume;
   recording a navigator reference signal of the navigator volume during a first time interval;
   recording a navigator signal of the navigator volume during a second time interval following the first time interval, the exciting being before the recording of the navigator signal;
   determining motion information for the examination object from a comparison of the navigator reference signal with the navigator signal, wherein navigator signals from the plurality of partial volumes are weighted differently during the comparison with the navigator reference signal for the generation of the motion information so that not all partial volumes of the navigator volume contribute equally to the determination of the motion information;
   adapting the region of interest for the generation of the at least one MR image taking account of the motion information; and
   determining an influence of the residual magnetization on the plurality of partial volumes,
   wherein the weighting of the plurality of partial volumes during the comparison with the navigator reference signal is performed in dependence on the residual magnetization in the associated partial volume.

2. The method of claim 1, wherein at least one partial volume of the navigator volume is weighted during the comparison such that the at least one partial volume is not taken into account at all in the determination of the motion information.

3. The method of claim 1, wherein the navigator volume is recorded in a plurality of different slices with different weightings in the determination of the motion information.

4. The method of claim 1, wherein the motion information takes account of predetermined types of motion,
   wherein the method further comprises determining, in the navigator volume, at least one first partial volume with which a motion outside the predetermined types of motion is possible, and
   wherein this first partial volume in the navigator volume is weighted lower in the determination of the motion information than the other partial volumes.

5. The method of claim 1, further comprising determining which at least one partial volume of the navigator volume is not taken into account at all in the determination of the motion information, and wherein no navigator signals are recorded from the at least one partial volume during the recording of the navigator signal.

6. The method of claim 1, further comprising recording at least one MR image in a plurality of part-segments,
   wherein in a time between the recording of two part-segments for the at least one MR image, navigator signals of the navigator volume are recorded at least twice,
   wherein the weighting of the partial volumes during a first recording of the navigator signals differs from the weighting of the partial volumes during a second recording of the navigator signals.

7. The method of claim 1, wherein, in the determination of the motion information, an iterative optimization method, in which an interpolation method is used to obtain identical coordinates in the case of a navigator reference data set generated from the navigator reference signal and a navigator data set generated from the navigator signal, is used, and
   wherein the different weighting of the partial volumes of the navigator signals is taken into account during the interpolation method.

8. The method of claim 7, wherein during the interpolation method, in the navigator data set, at least one partial volume that is not taken into account during the weighting is linearly interpolated by scanned adjacent regions of the navigator data set, and
   wherein the weighting of the scanned adjacent regions is taken into account during the linear interpolation.

9. A magnetic resonance (MR) system configured to conduct an MR examination of an examination object for compiling at least one MR image of the examination object with prospective motion correction, the MR system comprising:
   a controller configured to:
      define a region of interest in which the at least one MR image is to be generated from the examination object;
      define a navigator volume for recording navigator signals, wherein the navigator volume is subdivided into a plurality of partial volumes;
      excite at least one part of the navigator volume for recordation of MR signals for the at least one MR image, the excitation causing residual magnetization to form in the navigator volume;
      record a navigator reference signal of the navigator volume during a first time interval;
      record a navigator signal of the navigator volume during a second time interval following the first time interval, the excitation being before the recordation of the navigator signal;
      determine motion information for the examination object from a comparison of the navigator reference signal with the navigator signal, wherein navigator signals from the plurality of partial volumes are weighted differently during the comparison with the navigator reference signal for the generation of the motion information so that not all partial volumes of the navigator volume contribute equally to the determination of the motion information;
      adapt the region of interest for the generation of the at least one MR image taking account of the motion information; and
      determine an influence of the residual magnetization on the plurality of partial volumes,
   wherein the weighting of the plurality of partial volumes during the comparison with the navigator reference signal is performed in dependence on the residual magnetization in the associated partial volume.

10. A computer program product comprising a non-transitory computer-readable storage medium storing a program having instructions executable by a controller of a magnetic resonance (MR) system to conduct an MR examination of an examination object for compiling at least one MR image of the examination object with prospective motion correction, the instructions comprising:
   defining a region of interest in which the at least one MR image is to be generated from the examination object;
   defining a navigator volume for recording navigator signals, wherein the navigator volume is subdivided into a plurality of partial volumes;
   exciting at least one part of the navigator volume for recording MR signals for the at least one MR image, the exciting causing residual magnetization to form in the navigator volume;
   recording a navigator reference signal of the navigator volume during a first time interval;
   recording a navigator signal of the navigator volume during a second time interval following the first time interval, the exciting being before the recording of the navigator signal;
   determining motion information for the examination object from a comparison of the navigator reference signal with the navigator signal, wherein navigator signals from the plurality of partial volumes are weighted differently during the comparison with the navigator reference signal for the generation of the motion information so that not all partial volumes of the navigator volume contribute equally to the determination of the motion information;
   adapting the region of interest for the generation of the at least one MR image taking account of the motion information; and
   determining an influence of the residual magnetization on the plurality of partial volumes,
   wherein the weighting of the plurality of partial volumes during the comparison with the navigator reference signal is performed in dependence on the residual magnetization in the associated partial volume.

11. In a non-transitory computer-readable storage medium storing instructions executable by a controller of a magnetic resonance (MR) system to conduct an MR examination of an examination object for compiling at least one MR image of the examination object with prospective motion correction, the instructions comprising:
   defining a region of interest in which the at least one MR image is to be generated from the examination object;
   defining a navigator volume for recording navigator signals, wherein the navigator volume is subdivided into a plurality of partial volumes;
   exciting at least one part of the navigator volume for recording MR signals for the at least one MR image, the exciting causing residual magnetization to form in the navigator volume;
   recording a navigator reference signal of the navigator volume during a first time interval;
   recording a navigator signal of the navigator volume during a second time interval following the first time interval, the exciting being before the recording of the navigator signal;
   determining motion information for the examination object from a comparison of the navigator reference signal with the navigator signal, wherein navigator signals from the plurality of partial volumes are weighted differently during the comparison with the navigator reference signal for the generation of the motion information so that not all partial volumes of the navigator volume contribute equally to the determination of the motion information;

adapting the region of interest for the generation of the at least one MR image taking account of the motion information; and determining an influence of the residual magnetization on the plurality of partial volumes, wherein the weighting of the plurality of partial volumes during the comparison with the navigator reference signal is performed in dependence on the residual magnetization in the associated partial volume.

12. The non-transitory computer-readable storage medium of claim 11, wherein at least one partial volume of the navigator volume is weighted during the comparison such that the at least one partial volume is not taken into account at all in the determination of the motion information.

13. The non-transitory computer-readable storage medium of claim 11, wherein the navigator volume is recorded in a plurality of different slices with different weightings in the determination of the motion information.

14. The non-transitory computer-readable storage medium of claim 11, wherein the motion information takes account of predetermined types of motion, wherein the instructions further comprise determining, in the navigator volume, at least one first partial volume with which a motion outside the predetermined types of motion is possible, and wherein this first partial volume in the navigator volume is weighted lower in the determination of the motion information than the other partial volumes.

15. The non-transitory computer-readable storage medium of claim 11, wherein the instructions further comprise determining which at least one partial volume of the navigator volume is not taken into account at all in the determination of the motion information, and wherein no navigator signals are recorded from the at least one partial volume during the recording of the navigator signal.

16. The non-transitory computer-readable storage medium of claim 11, wherein the instructions further comprise recording at least one MR image in a plurality of part-segments, wherein in a time between the recording of two part-segments for the at least one MR image, navigator signals of the navigator volume are recorded at least twice, wherein the weighting of the partial volumes during a first recording of the navigator signals differs from the weighting of the partial volumes during a second recording of the navigator signals.

* * * * *

UNITED STATES PATENT AND TRADEMARK OFFICE
CERTIFICATE OF CORRECTION

PATENT NO. : 10,132,904 B2
APPLICATION NO. : 15/459925
DATED : November 20, 2018
INVENTOR(S) : Thomas Beck

Page 1 of 1

It is certified that error appears in the above-identified patent and that said Letters Patent is hereby corrected as shown below:

On the Title Page

Assignees:
Siemens Aktiengesellschaft, Munchen (DE); Siemens Healthcare GmbH, Erlangen (DE)
Should be replaced with:
"Siemens Healthcare GmbH, Erlangen (DE)"

Signed and Sealed this
Sixteenth Day of April, 2019

Andrei Iancu
*Director of the United States Patent and Trademark Office*